(12) United States Patent
Sandhu

(10) Patent No.: US 8,378,446 B2
(45) Date of Patent: Feb. 19, 2013

(54) SEMICONDUCTOR DEVICE ISOLATION STRUCTURES

(75) Inventor: Sukesh Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/099,166

(22) Filed: May 2, 2011

(65) Prior Publication Data

US 2011/0210417 A1    Sep. 1, 2011

Related U.S. Application Data

(62) Division of application No. 11/604,958, filed on Nov. 28, 2006, now Pat. No. 7,935,610.

(51) Int. Cl.
*H01L 21/70* (2006.01)
(52) U.S. Cl. ........................ 257/510; 257/500
(58) Field of Classification Search .............. 257/315, 257/500, E21.546, 510
See application file for complete search history.

(56) References Cited

U.S. PATENT DOCUMENTS

| | | | |
|---|---|---|---|
| 5,217,920 A | 6/1993 | Mattox et al. | |
| 6,455,912 B1 | 9/2002 | Kim et al. | |
| 6,759,707 B2 * | 7/2004 | Prall | 257/315 |
| 6,833,602 B1 | 12/2004 | Mehta | |
| 7,078,286 B1 * | 7/2006 | Mehta | 438/221 |
| 7,179,717 B2 | 2/2007 | Sandhu et al. | |
| 7,375,004 B2 | 5/2008 | Sandhu et al. | |
| 7,691,722 B2 | 4/2010 | Zhou | |
| 2004/0178450 A1 | 9/2004 | Lee et al. | |
| 2004/0253834 A1 | 12/2004 | Mothes et al. | |
| 2005/0020088 A1 | 1/2005 | Trivedi | |
| 2005/0181632 A1 | 8/2005 | Tan et al. | |
| 2005/0256907 A1 * | 11/2005 | Novik et al. | 707/200 |
| 2006/0043455 A1 * | 3/2006 | Batra et al. | 257/314 |
| 2006/0214258 A1 | 9/2006 | Kiyotoshi | |
| 2006/0258098 A1 * | 11/2006 | Lee | 438/258 |
| 2007/0212650 A1 | 9/2007 | Sim et al. | |
| 2008/0124888 A1 | 5/2008 | Sandhu | |

* cited by examiner

*Primary Examiner* — Bradley K Smith
(74) *Attorney, Agent, or Firm* — Schwegman, Lundberg & Woessner, P.A.

(57) ABSTRACT

Structures and methods are disclosed for the electrical isolation of semiconductor devices. A method of forming a semiconductor device may include providing a second integrated device region on a substrate that is spaced apart from a first integrated device region. An isolation region may be interposed between the first integrated device region and the second integrated device region. The isolation region may include an isolation recess that projects into the substrate to a first predetermined depth, and that may be extended to a second predetermined depth.

18 Claims, 6 Drawing Sheets

SEMICONDUCTOR DEVICE ISOLATION STRUCTURES

PRIORITY APPLICATION

This application is a divisional of U.S. application Ser. No. 11/604,958, filed Nov. 28, 2006, now U.S. Pat. No. 7,935,610 which is incorporated herein by reference in its entirety.

TECHNICAL FIELD

This disclosure relates generally to integrated circuit devices and fabrication methods, including semiconductor devices having improved isolation structures and methods of forming such devices.

BACKGROUND

The incorporation of increasing numbers of devices into progressively smaller integrated circuits remains an important challenge in Very Large Scale Integration (VLSI). Effective electrical isolation of the devices in the integrated circuit may be achieved by a variety of methods, including generating dielectric layers of suitable thickness, and/or by increasing the relative spacing of devices in the integrated circuit. Since the foregoing isolation methods typically occupy relatively large portions of the available "real estate" in the integrated circuit, the desirable objective of increasing integration density conflicts with the need to provide suitable electrical isolation for selected devices and regions in the integrated circuit.

One example of an integrated circuit requiring suitable electrical isolation are various semiconductor memory devices, such as a dynamic random access memory (DRAM), a static random access memory (SRAM), a flash memory, as well as other known memory devices. In each of these devices, a memory array is provided that includes a plurality of memory cells that are suitably arranged in rows and columns. Typically, a plurality of conductive word lines are positioned along the rows of the array to couple cells in respective rows, while a plurality of conductive bit lines are positioned along columns of the array and coupled to cells in the respective columns. The memory cells in the array generally include one or more transistors, and may also include a storage device, such as a capacitor, that are operable to store information by establishing logic levels (corresponding to a '1' or a '0') in the cells of the array. Information may be accessed from the cells when desired by activating various peripheral circuits that are coupled to the cells through the word lines and bitlines to retrieve the stored information.

The devices within cells of the array of the foregoing memory devices generally require electrical isolation from the peripheral circuits, since the voltages employed in the peripheral circuits may be significantly higher than the voltages typically used in the memory array. Although shallow trench isolation (STI) structures may be formed between the memory array and the peripheral circuits of a memory device in order to achieve electrical isolation, STI structures may not be suitably configured to provide adequate isolation in many instances. In particular, the STI structures may not be formed deeply enough in a substrate portion of the memory device to provide suitable isolation. Accordingly, what is needed in the art are devices having improved isolation structures and methods of forming the isolation structures.

BRIEF DESCRIPTION OF THE DRAWINGS

The various embodiments of the present invention are described in detail below with reference to the following drawings.

DETAILED DESCRIPTION

Various embodiments of the invention relate to semiconductor devices having improved isolation structures and methods of forming such devices. Many specific details of several embodiments of the invention are set forth in the following description and in FIGS. 1 through 11 to provide a thorough understanding of such embodiments. One skilled in the art, however, will understand that the present invention may have additional embodiments, and that many embodiments may be practiced without several of the details described in the following description.

Figure 1:
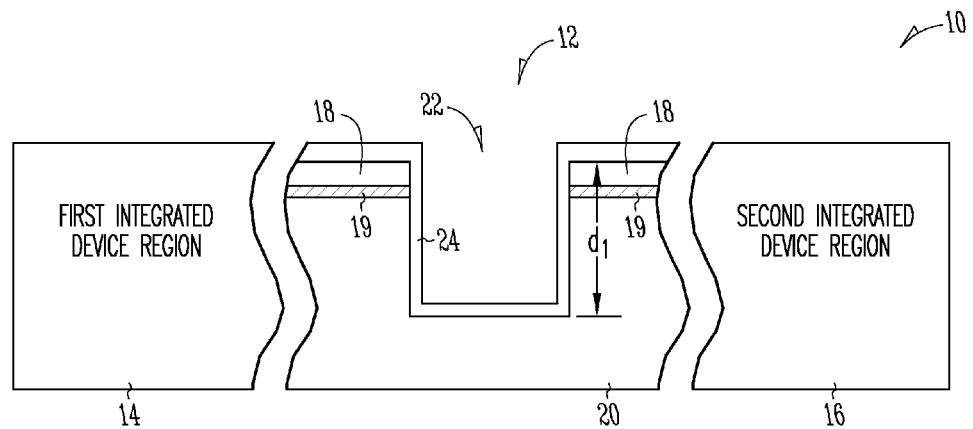
FIG. 1 is a partial cross sectional view that will be used to describe a method of forming a semiconductor device having an isolation region, according to various embodiments of the invention.

FIG. 1 is a partial cross sectional view that will be used to describe a method of forming a semiconductor device 10 having an isolation region 12, according to various embodiments of the invention. The first integrated device region 14 and the second integrated device region 16 each can include different operational characteristics, such as different voltage and/or current characteristics that may cause an electrical incompatibility between the respective regions 14 and 16. Accordingly, the isolation region 12 may be configured to provide electrical isolation between the first integrated device region 14 and the second integrated device region 16 of the semiconductor device 10. The disclosed isolation region 12 may advantageously provide better isolation between the first integrated device region 14 and the second integrated device region 16 by providing isolation that extends further into a semiconductor substrate than provided by prior art structures.

A first dielectric layer 18 may be formed on a surface of a substrate 20 that generally supports the semiconductor device 10. The substrate 20 may include a bulk silicon substrate, or it may include a silicon-on-insulator (SOI) structure, such as a silicon-on-sapphire (SOS). The first dielectric layer 18 may include a polysilicon layer, a nitride layer, or a silicon oxide layer that is thermally grown on the substrate 20, so that a buffer layer 19 is generated between the substrate 20 and the first dielectric layer 18. The first dielectric layer 18 may be coated with a photoresist material at a surface location where the isolation region 12 is desired. The photoresist material may then be patterned by exposing and developing the photoresist material to provide an opening of a predetermined width in the first dielectric layer 18. The first dielectric layer 18 may then be etched to reveal the underlying substrate 20. If the first dielectric layer 18 is a silicon nitride layer, then the layer 18 may be etched using a dry etch method. The substrate 20 is subjected to an anisotropic etching process to form an isolation recess 22 that extends into the substrate 20 to a predetermined first depth $d_1$. The anisotropic etching process may include, for example, a plasma etch procedure, although other suitable anisotropic etching processes may also be used. A trench dielectric layer 24 may then be deposited on the substrate 20, so that interior portions of the isolation recess 22 are relatively uniformly covered by the trench dielectric layer 24. The trench dielectric layer 24 may be deposited or grown on the substrate 20 by the chemical vapor deposition (CVD) of silicon dioxide, or by other known methods.

Figure 2:
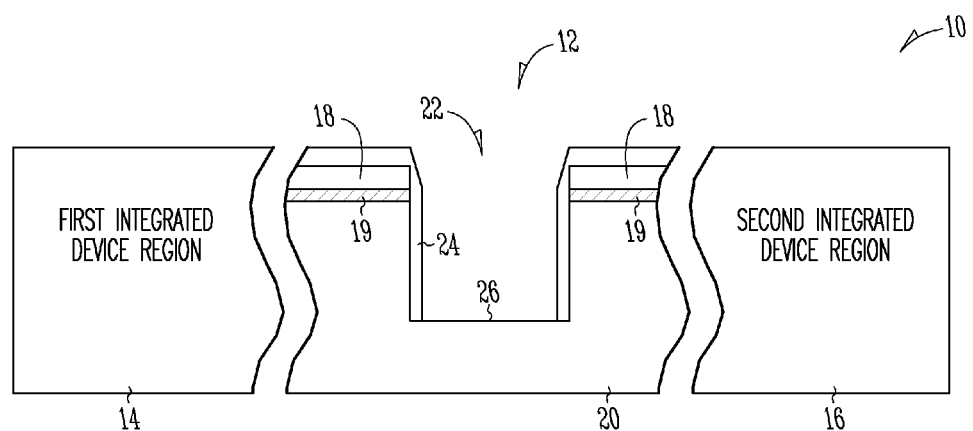
FIG. 2 is another partial cross sectional view that will be used to further describe the method of forming a semiconductor device having an isolation region, according to various embodiments of the invention.

Referring now to FIG. 2, the trench dielectric layer 24 may be selectively removed from the substrate 20 by spacer-etching a portion of the layer 24 that abuts the floor 26 of the isolation recess 22. Spacer-etching the portion of the trench dielectric layer 24 that abuts the floor 26 may be accomplished using reactive ion etching, although other suitable methods are known.

Figure 3:
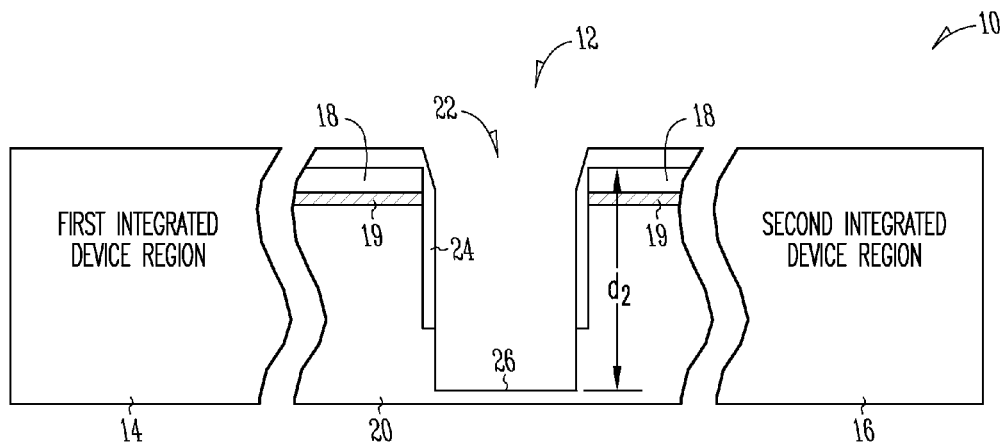
FIG. 3 is still another partial cross sectional view that will be used to further describe the method of forming a semiconductor device having an isolation region, according to various embodiments of the invention.

The isolation recess 22 of the isolation region 12 may be further etched so that the floor 26 is further extended into the substrate 20 to a predetermined second depth $d_2$, as shown in FIG. 3. In some embodiments, the floor 26 may be extended to provide a difference ($\Delta$) of approximately 200Å, where $\Delta=d_2-d_1$. In some embodiments, $\Delta$ is greater than 200Å. In either case, the isolation recess 22 of the isolation region 12 may be further extended using an anisotropic etch method, so that the etch method is relatively selective to the material comprising the substrate 20, and relatively non-selective to the material comprising the trench dielectric layer 24.

Figure 4:
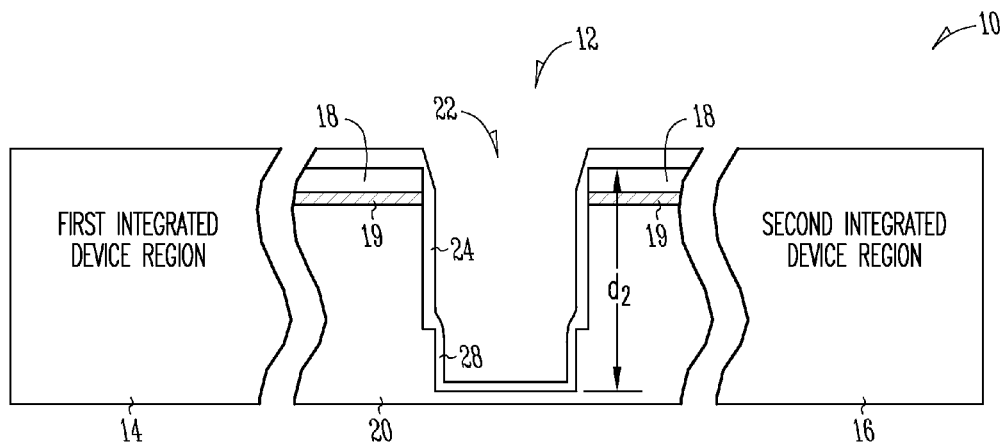
FIG. 4 is still yet another partial cross sectional view that will be used to further describe the method of forming a semiconductor device having an isolation region, according to various embodiments of the invention.

Turning now to FIG. 4, a second dielectric layer 28 may be formed within the isolation recess 22 so that the extended portions of the isolation recess 22 are covered by the second dielectric layer 28. In some embodiments, the second dielectric layer 28 may include a silicon dioxide layer that is thermally grown in the isolation recess 22. In some embodiments, the second dielectric layer 28 may include a silicon dioxide layer that is deposited using a CVD process.

Figure 5:
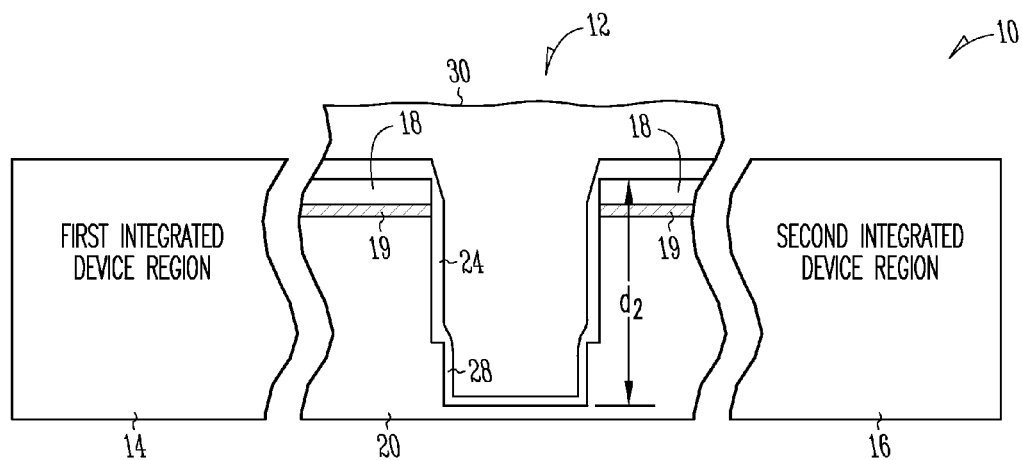
FIG. 5 is yet another partial cross sectional view that will be used to further describe the method of forming a semiconductor device having an isolation region, according to various embodiments of the invention.

Referring now to FIG. 5, the isolation recess 22 may be substantially filled with a dielectric filler 30. Although the dielectric filler 30 may be comprised of any suitable dielectric material, in some embodiments of the invention, the dielectric filler 30 may be formed by depositing a high density plasma (HDP) oxide using a high density plasma-chemical vapor deposition (HDP-CVD) process, which has been observed to generate an HDP oxide having excellent gap fill properties. The dielectric filler 30 may then be planarized in a conventional manner using chemical mechanical planarization (CMP) so that a substantially planar upper surface is obtained for the semiconductor device 10. Although the first integrated device region 14 and the second integrated device region 16 of the semiconductor device 10 have not been described in detail, it is understood that various known devices (e.g., sense amplifiers, and other peripheral devices) in the respective regions 14 and 16 may be formed either before or concurrent with the formation of the isolation region 12. Additionally, it is understood that the various known devices may also be formed in the first integrated device region 14 and the second integrated device region 16 after the formation of the isolation region 12.

Figure 6:
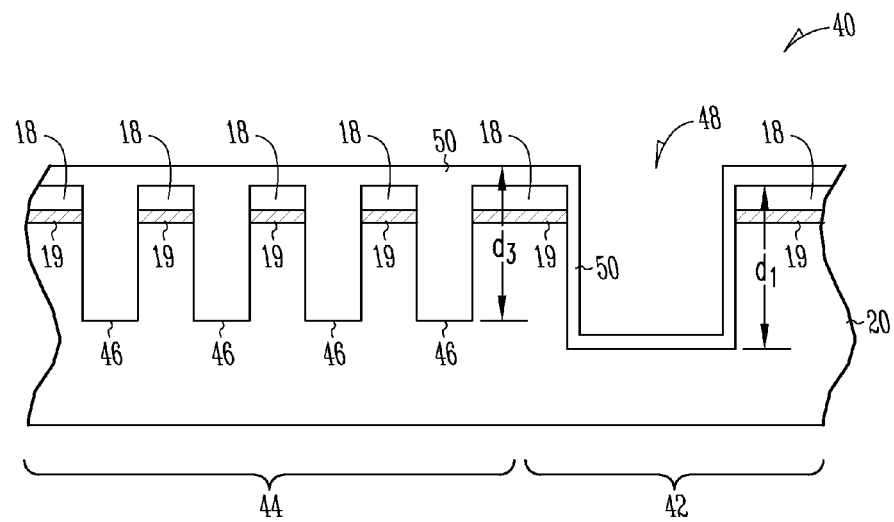
FIG. 6 is a partial cross sectional view describing a method of forming a semiconductor memory device having an isolation region, and a memory array region, according to various embodiments of the invention.

FIG. 6 is a partial cross sectional view that will be used to describe a method of forming a semiconductor memory device 40 having an isolation region 42, and an adjacent memory array region 44, according to various embodiments of the invention. The memory array region 44 may form a portion of various known memory devices, including a random access memory (RAM) and read only memory (ROM) devices. Accordingly, the adjacent memory device region 44 may include a plurality of device recesses 46 that may be used, for example, to form access devices for memory cells within the memory array, or to form other known devices in the semiconductor memory device 40. In the discussion that follows, it is understood that the isolation region 42 is operable to electrically isolate the memory device region 44 from other peripheral portions of the semiconductor memory device 40 (not shown in FIG. 6). For example, the peripheral portions of the semiconductor memory device 40 may include row and column decoders, sense amplifiers, read/write circuits, power supply devices, output buffers, and other similar devices, which may require effective electrical isolation from the memory array region 44. Additionally, it is understood that there may be a plurality of isolation regions 42 in the semiconductor memory device 40. Finally, although the isolation region 42 may be formed either before or after the formation of the memory device region 44, in the discussion that follows, portions of the memory array region 44 are assumed to be formed concurrently with the isolation region 42.

Still referring to FIG. 6, the first dielectric layer 18 deposited on the substrate 20 may be coated with a photoresist and patterned to form a plurality of openings in the first dielectric layer 18 that correspond to the desired locations for the device recesses 46 and one or more isolation recesses 48. As discussed in greater detail above, the substrate 20 may then be formed by anisotropically etching the substrate 20 until the device recesses 46 are etched to a depth $d_3$, and the isolation recesses 48 are formed to the depth $d_1$. For example, in some embodiments, a difference $\Delta$ in recess depths may be approximately about 500Å, where $\Delta=d_1-d_3$. In some embodiments, the difference $\Delta$ may be greater than 500Å. A conformal dielectric layer 50 may then be deposited on the semiconductor memory device 40 that at least partially fills the device recesses 46, and also covers the interior portions of the isolation recess 48. In some embodiments, the conformal dielectric layer 50 may be a silicon dioxide layer that is formed by the pyrolysis of tetraethyl orthosilicate (TEOS) using a CVD system, or alternately, in a furnace tube, or using other similar devices.

Figure 7:
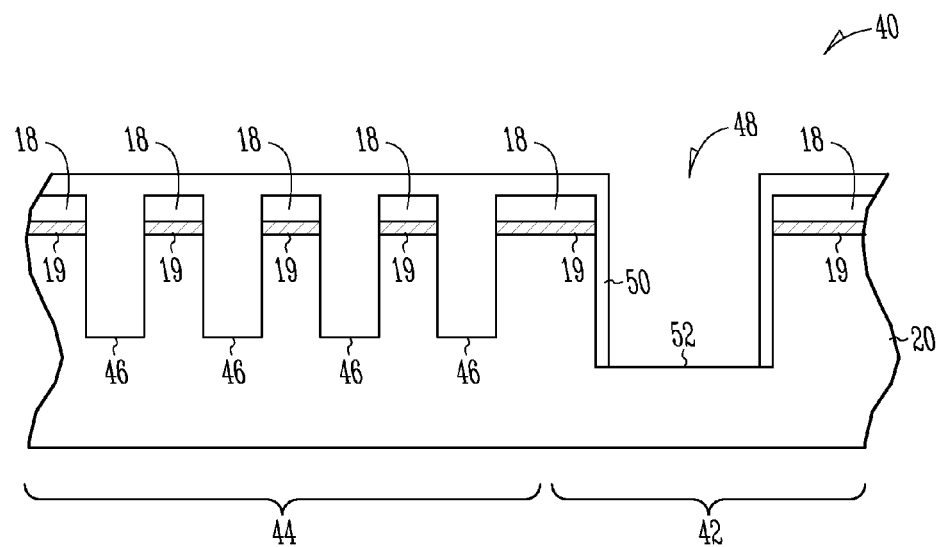
FIG. 7 is another partial cross sectional view describing a method of forming a semiconductor memory device having an isolation region, and a memory array region, according to various embodiments of the invention.

Turning now to FIG. 7, a portion of the conformal dielectric layer 50 adjacent to the floor 52 of the isolation recess 48 may be selectively removed by spacer etching the recess 48, as described in detail above, so that the material comprising the substrate 20 is exposed at the floor 52 of the recess 48. Since spacer etching the recess 48 may also remove a portion of the conformal dielectric layer 50 that is deposited on an upper surface of the substrate 20, a suitable thickness of the layer 50 may be applied to assure that a portion of the layer 50 remains following the spacer etch. Accordingly, in some embodiments, the silicon dioxide formed by TEOS may be deposited on the first dielectric layer 18 to a depth of approximately 350Å, although other suitable depths may also be used.

Figure 8:
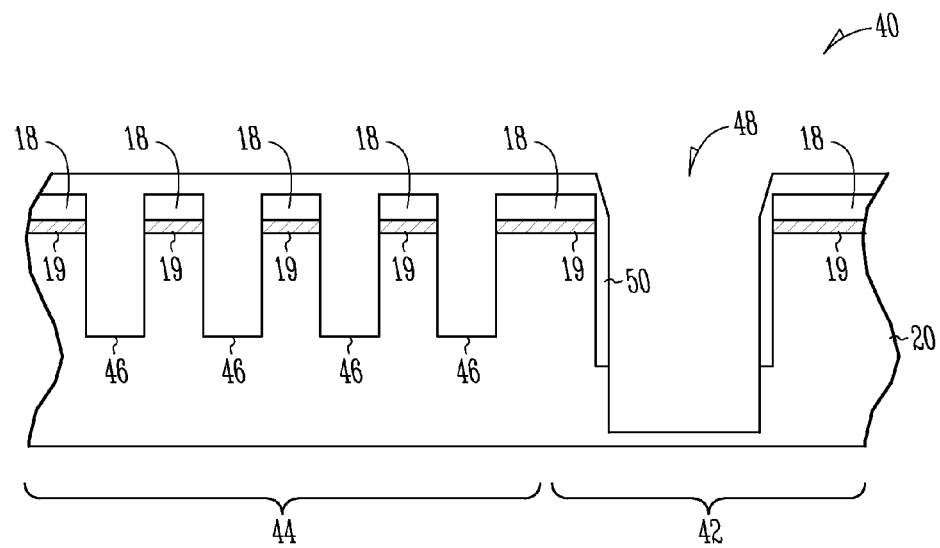
FIG. 8 is still another partial cross sectional view describing a method of forming a semiconductor memory device having an isolation region, and a memory array region, according to various embodiments of the invention.

Referring to FIG. 8, the isolation recess 48 may be further selectively etched to extend the isolation recess 48 further into the substrate 20. In some embodiments of the invention, the isolation recess 20 is extended approximately 200Å further into the substrate 20. The isolation recess 48 may be extended into the substrate 20 to a depth greater than 200 Å if desired. As described earlier, the isolation recess 48 may be extended by etching the recess 48 using an anisotropic etching method, such as plasma etching, ion milling, reactive ion etching, and other suitable anisotropic etching processes.

Figure 9:
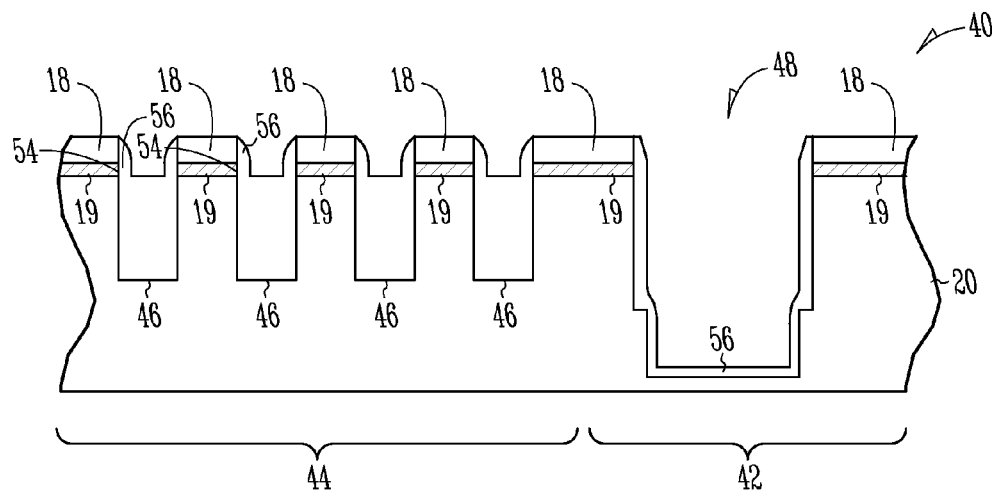
FIG. 9 is still yet another partial cross sectional view describing a method of forming a semiconductor memory device having an isolation region, and a memory array region, according to various embodiments of the invention.

A selective etch process may be performed on the conformal dielectric layer 50, as shown in FIG. 9. Accordingly, a desired thickness of the layer 50 may be obtained following the extension of the isolation recess 48. In particular, a portion of the layer 50 that extends into the device recesses 46 may be removed to expose sidewall portions 54 within the device recesses 46. The conformal dielectric layer 50 may be selectively etched using a selective wet etch method, such as a buffered oxide etch (BOE) formula. For example, the BOE formula may include a hydrofluoric acid solution with ammonium fluoride as a buffer, although other BOE formulas are known. A spacer dielectric 56 may then be formed within the extension of the isolation recess 48, and also adjacent to the exposed portions 54 within the device recesses 46. The spacer dielectric 56 may be generated using a shallow trench isolation (STI) oxidation of the device 40, or by other known methods. After the isolation recess 48 has been extended to a desired depth, a thin sidewall oxide liner (not shown in FIG. 9) may be applied that is operable to heal any damage to the substrate 20.

Figure 10:
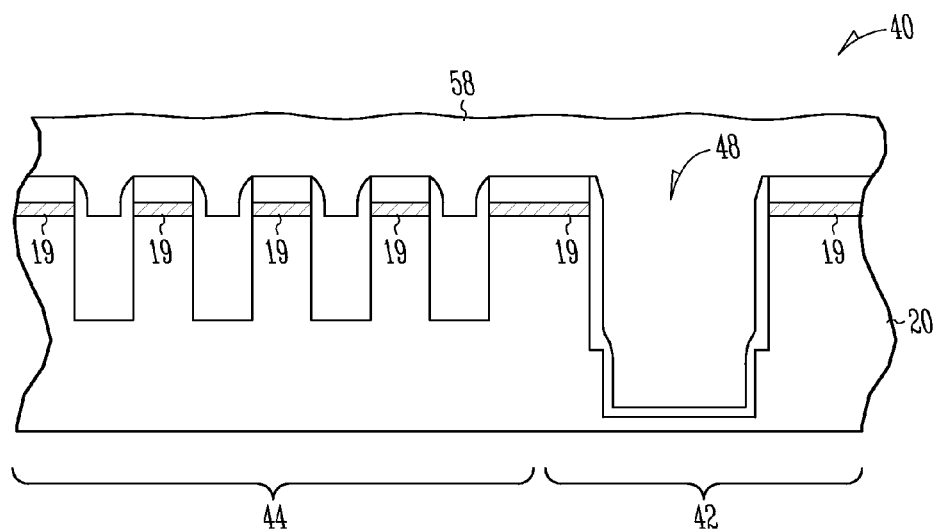
FIG. 10 is another partial cross sectional view describing a method of forming a semiconductor memory device having an isolation region, and a memory array region, according to various embodiments of the invention.

FIG. 10 shows a dielectric filler 58 applied to the semiconductor memory device 40. As shown, the dielectric filler 58 substantially fills the isolation recess 48, and at least partially fills the device recesses 46. The dielectric filler 58 may be generated using a HDP CVD process, as described in detail above, or by other known methods. Excess portions of the dielectric filler 58 may be removed from the semiconductor memory device 40 using, for example, chemical mechanical planarization (CMP), or other similar methods. Optionally, the BOE etch described above may be performed following the performance of the CMP.

Still referring to FIG. 10, other known processes may now be performed on the semiconductor memory device 40 to complete the formation of the device 40. For example, such known processes may include selective masking, photolithography, etching, material deposition, oxidation, selective doping, planarization and other known fabrication methods.

Figure 11:
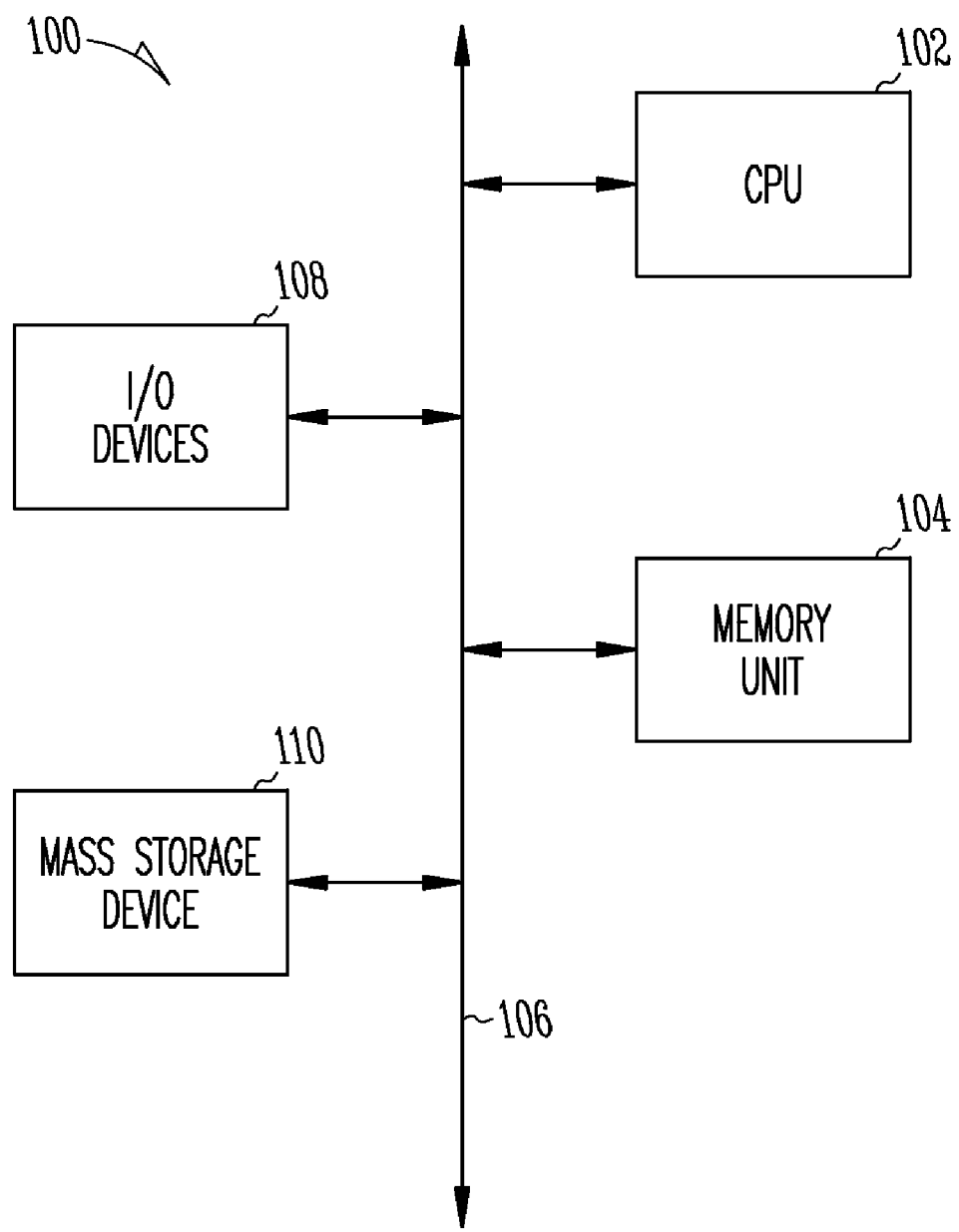
FIG. 11 is a diagrammatic block view of a processing system according to various embodiments of the invention.

FIG. 11 is a diagrammatic block view of a processing system 100 according to various embodiments of the invention. The processing system 100 may include a central processing unit (CPU) 102, which may include any digital device capable of receiving data and programmed instructions, and processing the data according to the programmed instructions. Accordingly, the CPU 102 may include a microprocessor, such as a general purpose single-chip or multi-chip microprocessor, or it may include a digital signal processing unit, or other similar programmable processing units. The CPU 102 is configured to communicate with a memory unit 104 over a communications bus 106. The memory unit 104 and/or the CPU 102 may include one or more isolation regions structured and/or formed in accordance with the foregoing embodiments of the invention, such as the isolation region 12 shown in FIG. 5, and the isolation recess 48 shown in FIG. 10. The processing system 100 may also include various other devices that are coupled to the bus 106, which are operable to cooperatively interact with the CPU 102 and the memory unit 104. For example, the processing system 100 may include one or more input/output (I/O) devices 108, such as a printer, a display device, a keyboard, a mouse, or other known input/output devices. The processing system 100 may also include a mass storage device 110, which may include a hard disk drive, a floppy disk drive, an optical disk device (CD-ROM), or other similar devices. While a processing system has been illustrated and described, one skilled in the art will readily recognize that the various embodiments of present invention may be included in a plurality of other electronic devices, such as, without limitation, a cellular telephone, a digital camera, a personal digital assistant (PDA), and various electronic devices incorporated into various terrestrial and flight vehicles.

While the various embodiments of the invention have been illustrated and described, as noted above, many changes can be made without departing from the scope of this disclosure. Although the certain foregoing embodiments of the isolation region are described with reference to memory devices, it is understood that the foregoing embodiments may also be used in a wide variety of other semiconductor devices. With respect to memory devices in particular, the foregoing embodiments may be incorporated, without significant modification, to a static memory, a dynamic memory such as a DRAM, an extended data out dynamic random access memory (EDO DRAM), a synchronous dynamic random access memory, a double data rate synchronous dynamic random access memory (DDR SDRAM), a synchronous link dynamic random access memory (SLDRAM), a video random access memory (VRAM), a rambus dynamic random access memory (RDRAM), a static random access memory (SRAM), a flash memory, as well as other known memory devices.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features may be grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A semiconductor memory device, comprising:
a memory array region comprising a plurality of device recesses;
an isolation region adjacent to the memory array region, wherein the isolation region includes an isolation recess that extends to a first depth;
an extended recess within the isolation recess that extends to a second depth greater than the first depth;
a conformal dielectric layer that covers only wall portions of the isolation recess and fills each of the plurality of device recesses separated from the isolation recess; and
a dielectric filler, wherein the dielectric filler fully fills the isolation recess and the extended recess, and partially fills each of the plurality of device recesses.

2. The semiconductor memory device of claim 1, wherein the extended recess extends into the isolation recess approximately 200Å.

3. The semiconductor memory device of claim 1, wherein the plurality of device recesses extend to a recess depth, and wherein the extended recess further extends to approximately 500Å beyond the recess depth.

4. The semiconductor memory device of claim 3, wherein the recess depth of the plurality of device recesses is less than the first depth of the isolation recess.

5. The semiconductor memory device of claim 1, further comprising a substrate, and a first dielectric layer on a surface of the substrate that is selectively removed at locations corresponding to the device recesses and the isolation recess.

6. The semiconductor memory device of claim 1, wherein the extended recess extends into the isolation recess through a floor of the isolation recess.

7. The semiconductor memory device of claim 1, wherein the dielectric filler substantially fills the isolation recess.

8. The semiconductor memory device of claim 1, wherein the extended recess further comprises a spacer dielectric disposed within the extended recess.

9. The semiconductor memory device of claim 8, wherein the spacer dielectric is disposed within a portion of the device recesses.

10. The semiconductor memory device of claim 1, wherein the conformal dielectric layer further comprises a tetraethyl orthosilicate (TEOS).

11. The semiconductor memory device of claim 1, wherein the memory array region further comprises an array configured as one of a static random access memory (SRAM), a dynamic random access memory (DRAM), or a flash memory.

12. A processing system, comprising:
a central processing unit (CPU); and
a memory device operatively coupled to the CPU by a communications bus, the memory device including:
a memory array region comprising a plurality of device recesses;
an isolation region adjacent to the memory array region that includes an isolation recess that extends to a first depth;
an extended recess formed by extending the isolation recess to a second depth greater than the first depth;
a conformal dielectric layer that covers only wall portions of the isolation recess and fills each of the plurality of device recesses separated from the isolation recess; and
a dielectric filler, wherein the dielectric filler fully fills the isolation recess and the extended recess, and partially fills each of the plurality of device recesses.

13. The processing system of claim 12, further comprising at least one input/output (I/O) device and a mass storage device operatively coupled to the communications bus.

14. The processing system of claim 13, wherein the at least one I/O device includes at least one of a printer, a display device, a keyboard and a mouse, and further wherein the mass storage device includes at least one of a hard disk drive, a floppy disk drive and an optical disk drive.

15. A semiconductor memory device, comprising:
an isolation region adjacent to a memory array region comprising a device recess, the isolation region including an isolation recess that includes a first interior wall portion covered by a conformal dielectric; and
an extended recess extending into the isolation recess, the extended recess including a second interior wall portion and a floor portion, the second interior wall portion and the floor portion of the extended recess being substantially covered by a second dielectric that is different from the conformal dielectric, wherein the conformal dielectric fills the device recess separated from the isolation recess, and covers only the first interior wall portion of the isolation recess.

16. The semiconductor memory device of claim 15, further comprising a dielectric filler substantially filling the isolation recess and the extended recess.

17. The semiconductor memory device of claim 15, wherein the extended recess extends into a substrate of the semiconductor memory device through a floor of the isolation floor.

18. The semiconductor memory device of claim 15, wherein the memory array region has a depth less than a depth of the isolation recess.

* * * * *